(12) United States Patent
Cahalen et al.

(10) Patent No.: US 7,955,978 B2
(45) Date of Patent: Jun. 7, 2011

(54) ENHANCED METHOD OF FORMING NICKEL SILICIDES

(75) Inventors: John P. Cahalen, Somerville, MA (US); Gary Hamm, Billerica, MA (US); George R. Allardyce, Hinckley (GB); David L. Jacques, Northbridge, MA (US)

(73) Assignee: Rohm and Hass Electronic Materials LLC, Marlborough, MA (US)

( * ) Notice: Subject to any disclaimer, the term of this patent is extended or adjusted under 35 U.S.C. 154(b) by 0 days.

(21) Appl. No.: 12/868,535

(22) Filed: Aug. 25, 2010

(65) Prior Publication Data

US 2011/0065274 A1 Mar. 17, 2011

Related U.S. Application Data

(60) Provisional application No. 61/275,085, filed on Aug. 25, 2009.

(51) Int. Cl.
*H01L 21/44* (2006.01)

(52) U.S. Cl. ............... 438/682; 438/664; 257/E21.199; 257/E21.296

(58) Field of Classification Search ............... 438/630, 438/655, 664, 682, FOR. 362; 257/E21.199, 257/E21.296
See application file for complete search history.

(56) References Cited

U.S. PATENT DOCUMENTS

| 4,042,951 | A | * | 8/1977 | Robinson et al. ............. 257/794 |
|---|---|---|---|---|
| 4,144,139 | A | | 3/1979 | Durkee |
| 4,321,283 | A | | 3/1982 | Patel et al. |
| 4,424,241 | A | | 1/1984 | Abys |
| 4,451,969 | A | | 6/1984 | Chaudhuri |
| 4,609,565 | A | | 9/1986 | Yates |
| 5,011,565 | A | | 4/1991 | Dube et al. |
| 5,494,710 | A | | 2/1996 | Mallory, Jr. |
| 5,543,333 | A | | 8/1996 | Holdermann |
| 5,803,957 | A | | 9/1998 | Murakami et al. |
| 6,127,052 | A | * | 10/2000 | Tomari et al. ............. 428/680 |
| 6,406,743 | B1 | | 6/2002 | Lee et al. |
| 6,756,682 | B2 | | 6/2004 | Sinha et al. |
| 6,787,450 | B2 | | 9/2004 | Sinha et al. |
| 6,899,816 | B2 | | 5/2005 | Padhi et al. |
| 6,905,622 | B2 | | 6/2005 | Padhi et al. |
| 7,256,498 | B2 | | 8/2007 | Huang et al. |
| 7,514,353 | B2 | | 4/2009 | Weidman et al. |
| 2004/0005468 | A1 | | 1/2004 | Steinecker |
| 2005/0212058 | A1 | | 9/2005 | Huang et al. |
| 2007/0167009 | A1 | | 7/2007 | Chen et al. |

OTHER PUBLICATIONS

Foggiato et al.; "Optimizing the formation of nickel silicide";.Materials Science and Engineering B 114-115 (2004), pp. 56-60.
Rinderknecht et al.; "In situ high temperature synchrotron-radiation diffraction studies of silicidation processes in nanoscale Ni layers"; Microelectronic Engineering 70 (2003; pp. 226-232.

* cited by examiner

*Primary Examiner* — Matthew Smith
*Assistant Examiner* — Quovaunda Jefferson
(74) *Attorney, Agent, or Firm* — John J. Piskorski

(57) ABSTRACT

Silicon containing substrates are coated with nickel. The nickel is coated with a protective layer and the combination is heated to a sufficient temperature to form nickel silicide. The nickel silicide formation may be performed in oxygen containing environments.

7 Claims, No Drawings

ENHANCED METHOD OF FORMING NICKEL SILICIDES

This application claims the benefit of priority under 35 U.S.C. §119(e) to U.S. Provisional Application No. 61/275,085, filed Aug. 25, 2009, the entire contents of which application are incorporated herein by reference.

The present invention is directed to an enhanced method of forming nickel silicides. More specifically, the present invention is directed to an enhanced method of forming nickel silicides where the number of processing steps is reduced.

Silicides in general may be used for a variety of purposes in the semiconductor and advanced packing technologies, such as forming gate electrodes, ohmic contacts, interconnection lines, Schottky barrier diode contacts, photovoltaics, solar cells and optoelectronic components. Silicides may be formed by a variety of techniques including codeposition, such as cosputtering and coevaporation and chemical vapor deposition (CVD) and thermal annealing of a metal layer deposited on the silicon subtrate. For example, when metal silicides are formed by coevaporation or cosputtering the metal is deposited on the silicon substrate and then annealed at high temperatures and causes the metal to diffuse into the silicon where the metal combines with the silicon to make the metal silicide. Annealing typically occurs in a vacuum or an inert gas atmosphere to prevent oxidation of the metal deposits. Both the deposition processes and annealing in an inert environment or under a vacuum require the use of specially designed and costly apparatus.

After annealing metal layers are typically deposited on the metal silicide to build-up and form conductive tracks or electrodes. Typically the silicide must be activated prior to depositing such metal layers. Activation may be done by deposition of catalytic material on the silicide; however, this requires additional multiple steps to the overall process or use of catalytic colloid compounds. Catalytic colloid compounds may adhere to dielectric materials selectively coated onto the silicon and result in undesired, excessive, and non-selective deposition of metal on the dielectric. Non-selective deposition of metal may lead to surface contamination, unwanted diffusion of conductive materials into dielectric materials, and even device failure from short circuits and other device irregularities. This not only increases the number of processing steps but whenever a activation step is included prior to metallization there is a risk of not properly activating the metal layer, thus resulting in adhesion failure between metal layers.

U.S. Pat. No. 6,787,450 discloses a method of forming silicides on semiconductor devices and using electroless metal deposition to form conductors. The semiconductors may be silicon based, silicon-germanium, germanium or gallium arsenide. The semiconductor material is selectively coated with an insulating layer leaving exposed regions of the semiconductor. A layer of titanium is deposited on the exposed semiconductor by chemical vapor deposition and the semiconductor is heat annealed to temperatures high enough to form titanium silicide. In addition to titanium, other metals such as tungsten, cobalt and nickel may be used to form the silicide; however, titanium is the preferred metal because both cobalt and nickel silicides have the disadvantage of high silicon consumption and n+ junction leakage.

During the annealing process not all of the titanium is consumed in the formation of the silicide. Any remaining titanium on the surface of the silicide is removed by etching or stripping using a solution which includes a mixture of ammonium hydroxide and hydrogen peroxide. After the titanium is removed, the silicide is activated prior to depositing any metal layers on the silicide. Activation removes oxides and oxide-containing compounds from the titanium silicide. Such oxides compromise metal adhesion to the silicide and ultimately compromise the reliability of any electronic device in which the semiconductor is used. During activation the titanium silicide layer is slightly etched. Activation may be done with an etching solution containing ammonium peroxide. Other activation methods include contacting the silicide with hydrofluoric acid (HF) alone or a mixture of HF and palladium chloride. Various surfactants may also be included in the activation solution. If cobalt or nickel silicide is formed instead of titanium silicide, it is also necessary to activate the silicides prior to electroless build-up to form the conductor. After activation, the semiconductor is rinsed and then electrolessly plated with nickel, nickel alloy, cobalt or cobalt alloy to form the conductor.

Although there are methods for forming metal silicides on semiconductor wafers, there is still a need for enhanced and more efficient methods of forming silicides.

A method includes providing a silicon containing substrate; depositing a nickel layer onto the silicon containing substrate; depositing a silver layer onto the nickel layer; and heating the silicon containing substrate with the nickel and silver layers to a sufficient temperature to form a nickel silicide.

The silver metal layer coating adjacent the nickel metal layer which is adjacent the silicon containing substrate protects the nickel metal from damage due to the high temperatures used in silicide formation. Additionally, the silver layer permits silicide formation in a standard room environment or oxygen containing atmosphere, thus eliminating the need for specially designed and costly apparatus as well as additional time consuming process steps. The method may eliminate the time consuming step of having to activate the nickel silicide prior to depositing silver on the nickel. The elimination of such an activation step reduces the probability of adhesion failure between the nickel and the silver. The silver layer prevents the formation of undesired oxides during sintering, thus reducing the probability of separation of metal layers and ultimately preventing the mal-function of electronic devices in which the semiconductor is used. Accordingly, the nickel silicide method provides for an enhanced and more efficient method over many conventional methods of silicide formation.

As used throughout this specification, the terms "depositing" and "plating" are used interchangeably. The terms "current tracks" and "current lines" are used interchangeably. The terms "composition" and "bath" are used interchangeably. The indefinite articles "a" and "an" are intended to include both the singular and the plural. The term "silicide" means a binary compound of silicon and another element, usually a metal. The term "selectively depositing" means that deposition occurs in specific desired areas on a substrate. The term "lux=lx" is a unit of illumination equal to one lumen/m$^2$; and one lux=1.46 milliwatts of radiant electromagnetic (EM) power at a frequency of 540 tetrahertz. The following abbreviations have the following meanings unless the context clearly indicates otherwise: ° C.=degrees Celsius; g=grams; mL=milliliter; L=liter; A=amperes; dm=decimeter; cm=centimeter; μm=microns; nm=nanometers; UV=ultraviolet; and IR=infrared. All percentages and ratios are by weight unless otherwise indicated. All ranges are inclusive and combinable in any order except where it is logical that such numerical ranges are constrained to add up to 100%.

Photovoltaics and solar cells may be composed of monocrystalline or polycrystalline or amorphous silicon containing semiconductor wafers. Such wafers typically have a p-type base doping.

The semiconductor wafers may be circular, square or rectangular in shape or may be any other suitable shape. Such wafers may have a wide variety of dimensions and surface resistivities. For example, circular wafers may have a diameter of 150 nm, 200 nm, 300 nm, 400 nm, or greater.

The back side of a wafer is metallized to provide a low resistance wafer. Any conventional method may be used. Typically, the surface resistance, also known as sheet resistance, of the semiconductor wafer is 40 to 90 ohms/square, or such as from 40 ohms/square to 60 ohms/square, or such as from 60 ohms/square to 80 ohms/square.

The entire back side may be metal coated or a portion of the back side may be metal coated, such as to form a grid. Such back side metallization may be provided by a variety of techniques, and may be done prior to the metallization of the front side of the wafer. In one embodiment, a metal coating is applied to the back side in the form of an electrically conductive paste, such as a silver-containing paste, an aluminum-containing paste or a silver and aluminum-containing paste; however, other suitable pastes known in the art also may be used. Such conductive pastes typically include conductive particles embedded in a glass matrix and an organic binder. Conductive pastes may be applied to the wafer by a variety of techniques, such as screen printing. After the paste is applied, it is fired to remove the organic binder. When a conductive paste containing aluminum is used, the aluminum partially diffuses into the back side of the wafer, or if used in a paste also containing silver, may alloy with the silver. Use of such aluminum-containing paste may improve the resistive contact and provide a "p+"-doped region. Heavily doped "p+"-type regions by previous application of aluminum or boron with subsequent interdiffusion may also be produced. In an alternate embodiment, a seed layer may be deposited on the back side of the wafer and a metal coating may be deposited on the seed layer by electroless or electrolytic plating.

The front side of the wafer may optionally be subjected to crystal-oriented texture etching in order to impart to the surface an improved light incidence geometry which reduces reflections. This may be done by contacting the semiconductor wafer with acid, such as hydrofluoric acid, or alkali to texture or roughen the surface.

To produce the semiconductor junction, phosphorus diffusion or ion implantation takes place on the front side of the wafer to produce an n-doped (n+ or n++) region and provides the wafer with a PN junction. The n-doped region may be referred to as the emitter layer.

An anti-reflective layer is added to the front side or emitter layer of the wafer. In addition the anti-reflective layer may serve as a passivation layer. Suitable anti-reflective layers include, without limitation, silicon oxide layers such as $SiO_x$, silicon nitride layers such as $Si_3N_4$, a combination of silicon oxide and silicon nitride layers, and combinations of a silicon oxide layer, a silicon nitride layer with a titanium oxide layer such as $TiO_x$. In the foregoing formulae, x is the number of oxygen atoms. Such anti-reflective layers may be deposited by a number of techniques, such as by various vapor deposition methods, for example, chemical vapor deposition and physical vapor deposition.

The front side of a wafer contains a metallized pattern. For example, the front side of a wafer may be composed of current collecting lines and current busbars. Current collecting lines are typically transverse to the busbars and typically have a relatively fine-structure (i.e. dimensions) relative to current busbars.

The pattern reaches through the antireflective layer to expose the surface of the semiconductor body of the wafer. Alternatively trenches may be formed in the openings to create a selective emitter. These trenches may be regions of high doping. A variety of processes may be used to form the pattern, such as, but not limited to, laser ablation, mechanical means, and lithographic processes, all of which are well known in the art. Such mechanical means include sawing and scratching. Typical photolithographic processes include disposing an imageable material on the surface of the wafer, patterning the imageable material to form openings in the anti-reflective layer, transferring the pattern to the wafer, depositing a nickel layer in the openings and removing the imageable material. In one embodiment, the imageable material is removed before the step of depositing a nickel layer in the openings. In another embodiment, the imageable material is removed after the step of depositing a nickel layer in the openings. When the imageable material is present during the nickel deposition step, such imageable material typically avoids any dyes, such as contrast dyes, that absorb in the wavelength of radiation used during the nickel deposition step. Imageable material present during the plating step typically contains a dye which has a minimum light transmittance of 40-60%.

When the imageable material is a liquid, such material may be disposed on the surface of the wafer by any suitable technique such as, but not limited to, by spin coating, inkjet printing, curtain coating, and roller coating. When the imageable material is a dry film, such material may be disposed on the surface of the wafer by vacuum lamination.

The imageable material is patterned by exposing the imageable material to actinic radiation through a mask. The choice of actinic radiation will depend upon the particular imageable material selected. Lasers as well as other conventional sources of actinic radiation may be used to pattern the imageable material.

The pattern in the imageable material is next transferred to the semiconductor wafer substrate. Pattern transfer may be performed using wet chemical etching techniques or by using dry etching techniques. Suitable dry etching techniques include, without limitation, plasma etching such as reactive ion etching. The pattern typically is composed of lines of relatively narrow cross-sectional dimension which are current collecting lines and lines of relatively thick cross-sectional dimension which are busbars. The busbars are transverse to the current collecting lines.

The imageable material may be removed using any suitable polymer remover, such as those sold by Rohm and Haas Electronic Materials (Marlborough, Mass.). Such removers may be alkaline, acidic or essentially neutral.

A nickel seed layer is deposited on the front side conductive pattern. The nickel seed layer may be deposited by any conventional nickel deposition method known in the art. Typically, the nickel seed layer is deposited by light assisted nickel deposition. If the source of the nickel is an electroless nickel composition, plating is done without application of external current. If the source of the nickel is from an electrolytic nickel composition, a rear side potential (rectifier) is applied to the semiconductor wafer substrate. The light may be continuous or pulsed. Pulsed illumination can be achieved, for example, by interrupting the light with a mechanical chopper or an electronic device may be used to cycle power to the lights intermittently based on a desired cycle. Prior to depositing nickel, surface oxides are typically removed from the conductive pattern using a solution of 1% hydrofluoric acid.

In one embodiment the semiconductor is immersed in the nickel plating composition and light is applied throughout nickel deposition. In an alternative embodiment the semiconductor is immersed in the nickel plating composition and light is applied to the semiconductor at an initial intensity for a predetermined amount of time followed by reducing the initial light intensity to a predetermined amount for the remainder of the plating cycle to deposit a nickel layer onto the exposed part of the n doped front side of the doped semiconductor. The light intensity applied to the semiconductor substrate following the initial light intensity and applied for the remainder of the plating cycle is always less than the initial intensity. The absolute values of the initial light intensity and the reduced light intensity following the initial period vary and they may be varied during the plating process to achieve optimum plating results as long as the initial light intensity is higher than the light intensity for the remainder of the plating cycle. If the initial light intensity varies during the initial time period, the light intensity applied for the remainder of the plating cycle may be based on the average of the initial light intensity. Minor experimentation may be performed to determine a suitable initial light intensity, a suitable initial time period for applying the initial light intensity, and a light intensity applied for the remainder of the plating cycle.

In general the initial time period for applying the initial light intensity is greater than 0 seconds to 15 seconds. Typically, the initial light intensity is applied to the semiconductor for 0.25 seconds to 15 seconds, more typically 2 seconds to 15 seconds, most typically for 5 seconds to 10 seconds. In general, the reduced light intensity is 5% to 50% of the initial light intensity. Typically, the reduced light intensity is from 20% to 50%, or such as from 30% to 40% of the initial light intensity.

Light which may be used to initiate the plating process includes, but is not limited to, visible light, IR, UV and X-rays. Light sources include, but are not limited to, incandescent lamps, LED lights (light emitting diodes), infrared lamps, fluorescent lamps, halogen lamps and lasers. In general the amount of light initially applied to the semiconductor may be 8000 lx to 20,000 lx, or such as from 10,000 lx to 15,000 lx. In general the amount of light applied to the semiconductor wafer for the remainder of the nickel plating cycle may be from 400 lx to 10,000 lx, or such as from 500 lx to 7500 lx.

Typically, nickel is deposited through the openings in the anti-reflective layer and onto the exposed surface of the semiconductor wafer using an electroless nickel plating composition. The electroless nickel plating composition may or may not include a reducing agent. Typically, the electroless nickel plating composition does include a reducing agent. Such reducing agents include, but are not limited to sodium hypophosphite, potassium hypophosphite, thiourea and thiourea derivatives, hydantoin and hydantoin derivatives, hydroquinone and hydroquinone derivatives, resorcinol, and formaldehyde and formaldehyde derivatives, DEA (n-diethylamine borane), sodium borohydride and hydrazine. Such reducing agents may be used in conventional amounts such as from 0.1 g/L to 40 g/L. Examples of commercially available electroless nickel compositions include DURAPOSIT™ SMT 88 Electroless Nickel and NIPOSIT™ PM 980 and PM 988 Electroless Nickel. All are available from Rohm and Haas Electronic Materials, LLC, Marlborough, Mass., U.S.A.

Alternatively, electrolytic nickel compositions may be used. When an electrolytic composition is used, an applied rear side potential (rectifier) is used in addition to light to deposit the nickel. Typical current densities are from 0.1 $A/dm^2$ to 2 $A/dm^2$, and more typically from 0.5 $A/dm^2$ to 1.5 $A/dm^2$. The particular current requirement is dependent upon the particular size of the wafer used. The electroplating processes used are conventional. Suitable electrolytic nickel plating baths are commercially available as well as many which are disclosed in the literature. Examples of commercially available electrolytic nickel baths are the NICKEL GLEAM™ Electrolytic Nickel products obtainable from Rohm and Haas Electronic Materials, LLC. Other examples of suitable electrolytic nickel plating baths are the Watts-type baths disclosed in U.S. Pat. No. 3,041,255.

The nickel ions in the plating compositions may be provided by using any suitable solution-soluble nickel compound, typically a water soluble nickel salt. Such nickel compounds include, but are not limited to, nickel sulfate, nickel chloride, nickel sulfamate, and nickel phosphate. Mixtures of nickel compounds may be used in the plating compositions. Such mixtures may be metal compounds having the same metal but being different compounds, such as a mixture of nickel sulfate and nickel chloride. The nickel compounds are added to the plating compositions in an amount sufficient to provide a nickel ion concentration in the plating composition of 0.1 g/L to 150 g/L, typically from 0.5 g/L to 100 g/L, and more typically from 1 g/L to 70 g/L.

The nickel compounds are added to the plating compositions in an amount sufficient to provide a nickel ion concentration in the plating composition of 0.1 g/L to 150 g/L, more typically from 0.5 g/L to 100 g/L, and still more typically from 1 g/L to 70 g/L.

Any of a wide variety of electrolytes may be used in the nickel plating compositions, including acids and bases. Exemplary electrolytes include, without limitation, alkane sulfonic acids such as methane sulfonic acid, ethane sulfonic acid and propane sulfonic acid; alkylol sulfonic acids; aryl sulfonic acids such as toluene sulfonic acid, phenyl sulfonic acid and phenol sulfonic acid; amino-containing sulfonic acids such as amido sulfonic acid; sulfamic acid; mineral acids; carboxylic acids such as formic acid and haloacetic acids; hydrogen halide acids; and pyrophosphate. Salts of acids and bases also may be used as the electrolyte. Further, the electrolyte may contain a mixture of acids, a mixture of bases or a mixture of one or more acids with one or more bases. Such electrolytes are generally commercially available from a variety of sources, such as Aldrich Chemical Company, Milwaukee, Wis.

Optionally a wide variety of surfactants may be used in the nickel plating compositions. Any of anionic, cationic, amphoteric and nonionic surfactants may be used as long as it does not interfere with the performance of the nickel plating. Surfactants may be included in conventional amounts, such is well known in the art.

Optionally, the nickel plating compositions may contain one or more additional components. Such additional components include, without limitation, brighteners, grain refiners and ductility enhancers. Such additional components are well known in the art and are used in conventional amounts.

The nickel plating composition may optionally contain a buffering agent. Exemplary buffering agents include, but are not limited to, borate buffer (such as borax), phosphate buffer, citrate buffer, carbonate buffer, and hydroxide buffer. The amount of the buffer used is that amount sufficient to maintain the pH of the plating composition at a desired level, such amount being well known to those skilled in the art.

In general, the patterned semiconductor wafer is submerged in a nickel plating composition contained in a plating cell. A light source is positioned to illuminate the semiconductor wafer with light energy. The light source may be, for example, a fluorescent or LED lamp which provides energy within the wavelengths to which the semiconductor is photovoltaically sensitive. A variety of other light sources may be used, such as, but not limited to, incandescent lamps such as a 75 watt and 250 watt lamp, mercury lamps, halogen lamps and a 150 watt IR lamp.

The plating cell is of such a material as to be chemically inert with respect to the nickel plating composition and has a minimum light transmittance of 40-60%. Alternatively, the wafer can be positioned horizontally in the plating cell and illuminated from above the nickel plating composition, in which case the plating cell need not have at least the minimum light transmittance.

By illuminating the front of the semiconductor wafer with light energy, plating occurs on the front. The impinging light energy generates a current in the semiconductor. The rate of plating on the front is controllable by adjusting the light intensity, bath temperature, reducing agent activity, starting wafer conditions, doping level as well as other parameters which are known to workers in the art. If the plating bath is an electrolytic bath the rate of plating may also be adjusted by the rectifier. A nickel layer of 20 nm to 300 nm thickness, or such as from 50 nm to 150 nm is typically desired, with the exact thickness depending on various factors such as on the application, size, pattern and geometry.

Nickel plating compositions may have a pH in the range of 1 to 14, typically from 1 to 12, more typically from 1-8. The working temperature of the nickel plating compositions during plating may be from 10 to 100° C., or such as from 20 to 50° C.

After the nickel is deposited through the openings and adjacent to the exposed surface of the semiconductor wafer substrate, silver is immediately deposited adjacent to the nickel. Typically, the silver is deposited in less than one minute after nickel is plated, more typically, less than 30 seconds after nickel plating, most typically from 1 to 30 seconds. If silver is not plated on the nickel within a short time after nickel deposition, the nickel becomes passivated and must be activated prior to silver plating. Passivation is a general term to describe a metal layer which is resistant to plating. When plating does occur on a passivated metal, adhesion between the passivated metal and the metal deposited on it is poor and unreliable. Typically the deposited metal readily peels from the passivated metal. Accordingly, it is highly desirable to deposit the silver on the nickel within one minute or less after nickel plating otherwise an activation step may be required to achieve reliable adhesion between the nickel and the silver.

Conventional electroplating silver compositions may be used. The silver compositions may be cyanide containing silver compositions or cyanide-free silver compositions. Sources of silver ions may include, without limitation: silver potassium cyanide, silver nitrate, silver sodium thiosulfate, silver gluconate; silver-amino acid complexes such as silver-cysteine complexes; silver alkyl sulfonates, such as silver methane sulfonate. Mixtures of silver compounds may be used, such as a mixture of silver nitrate and silver-cysteine complex. The concentration of silver ions in the composition is typically in an amount of 2 g/L to 40 g/L. Such silver compounds are generally commercially available from a variety of sources, such as Aldrich Chemical Company, Milwaukee, Wis. Examples of commercially useful silver plating compositions are available as ENLIGHT™ Silver Plate 600 and 620 from Rohm and Haas Electronic Materials, LLC Marlborough, Mass.

A wide variety of conventional surfactants may be used in the silver plating compositions, such as anionic, cationic, amphoteric and nonionic surfactants. Surfactants may be included in conventional amounts. The silver plating compositions may contain one or more additional conventional components. Such additional components include, without limitation, electrolytes, buffers, brighteners, grain refiners, chelating agents, complexing agents, reducing agents, levelers and ductility enhancers. Such additional components are well known in the art and are used in conventional amounts.

Silver plating compositions may have a pH in the range of 1 to 14, typically from 1 to 12, and still more typically from 1-8. The working temperature of the plating compositions during metal plating is from 10 to 100° C., or such as from 20 to 60° C. The working temperature is typically in the range of 10 to 20° C., and more typically from 15 to 20° C. A chiller is typically used to maintain the silver plating composition at a temperature below room temperature.

Silver may deposited by light induced plating (LIP) or conventional silver electroplating methods well known in the art. The procedure of LIP plating is similar to that for plating the electrolytic nickel seed layer described above. In general, the patterned semiconductor wafer is submerged in a silver composition contained in a plating cell. The rear side of the semiconductor wafer is connected to a source of external current (rectifier). A silver anode placed in the silver plating composition is connected to the rectifier such that a completed circuit is formed between the components. Typical current densities are from 0.1 A/dm$^2$ to 5 A/dm$^2$, and more typically from 1 A/dm$^2$ to 3 A/dm$^2$. The total current requirement is dependent upon the particular size of the wafer used. Additionally, the silver anode provides a ready source of silver ions to replenish the silver plating composition with silver ions without the need to use an external source. A light source is positioned to illuminate the semiconductor wafer with light energy. The light source can be, for example, a fluorescent or LED lamp which provides energy within the wavelengths to which the semiconductor wafer is photovoltaically sensitive. A variety of other light sources may be used, such as, but not limited to, incandescent lamps such as a 75 watt and 250 watt lamps, mercury lamps, halogen lamps and a 150 watt IR lamp.

The plating cell is of such a material as to be chemically inert with respect to the silver plating composition and has a minimum light transmittance of 40-60%. Alternatively, the wafer can be positioned horizontally in the plating cell and illuminated from above the silver plating composition, in which case the plating cell need not have at least the minimum light transmittance.

By illuminating the front of the semiconductor wafer with light energy silver plating occurs on the nickel seed layer. Light intensity may range from 5000 lx to 15000 lx. The impinging light energy generates a current in the solar cell. When the silver plating bath is an electrolytic bath, an outside current is also applied using a conventional rectifier. The rate of plating on the front is controllable by adjusting the light intensity, bath temperature, starting wafer conditions, doping level and current level as well as other parameters which are known to workers in the art. A silver layer of 1 μm to 30 μm thickness, or such as from 5 μm to 15 μm is typically desired, with the exact thickness depending on various factors such as on the application, size, pattern and geometry.

Optionally, the semiconductor wafer may be edge isolated prior to metallization. Edge isolation reduces the probability of shunting the semiconductor wafer during metallization due to bridging of metal deposits from the n-type emitter layer to the p-type layer of the semiconductor wafer. Edge isolation may be done by applying a conventional plating resist, i.e., edge mask, along the edge of the semiconductor wafer prior to metallization. Such plating resists may be a wax based composition which includes one or more waxes, such as montan wax, paraffin wax, soy, vegetable waxes and animal waxes. In addition, such resists may include one or more cross-linking agents, such as conventional acrylates, diacrylates and triacrylates, and one or more curing agents to cure the resist upon exposure to radiation, such UV and visible light. Curing agents include, but are not limited to, conventional photoinitiators used in photoresists and other photosensitive compositions. Such photoinitiators are well known in the art and published in the literature. Such plating resists may be applied by conventional screen printing procedures or by selective ink jet processes. Alternatively, the semiconductor wafer may be edge isolated with the antireflective layer. This may be done by depositing the material used to make the antireflective layer on the edges of the semiconductor layer during formation of the antireflective layer.

After the silver metal is deposited onto and adjacent the nickel, the semiconductor is then sintered to form nickel silicide. Sintering is done with the silver deposited onto the nickel surface to improve adhesion between the silver and nickel. Sintering with the silver plated onto the nickel increases the window for sintering. In other words, sintering may be prolonged at a given peak temperature over conventional processes to provide improved bonding between the nickel and the silicon without concern for damage to the wafer. In many conventional processes keeping the semiconductor in the oven at a given temperature for too long may cause the nickel to diffuse too deeply into the wafer penetrating the emitter layer thus shunting the wafer. The improved bonding between the nickel and the silicon reduces the probability of adhesion failure between the nickel silicide and the silver. Further, silver is not incorporated into the silicide by the sintering temperatures, thus nickel silicide is formed with the silver protecting the nickel from oxidation during sintering. A furnace providing a wafer peak temperature of 380° C. or greater or from 400° C. to 550° C. may be used. Peak temperatures exceeding 650° C. are not used because at such high temperatures both nickel silicide and nickel disilicide may be formed. The formation of nickel disilicide is undesirable because it has a high contact resistance which reduces current flow in the semiconductor wafer. Typically, peak temperature times range from 2 seconds to 20 seconds, or such as from 5 seconds to 15 seconds. An example of a suitable furnace is a lamp based furnace (IR).

Since the silver layer protects the nickel from oxidation during sintering, sintering may be done in an oxygen containing environment as opposed to an inert gas atmosphere or vacuum. Accordingly, the steps and equipment required in sintering in an inert or vacuum environment are eliminated along with the costly apparatus required for such procedures. Also, the elimination of special inert gases further reduces the cost and complexity of the sintering process. In general, sintering is done for at least 3 minutes, or such as from 4 minutes to 10 minutes, or such as from 5 minutes to 8 minutes. Line speeds at which the semiconductor passes through the furnace may vary depending on the furnace used. Minor experimentation may be done to determine the appropriate line speed. Typically, the line speed is from 330 cm/minute to 430 cm/minute, or such as from 370 cm/minute to 420 cm/minute.

The sintering process has been described with particular reference to silicon semiconductor wafers used in solar cells; however, the sintering method may be used in the manufacture of components for other articles, such as photovoltaic devices, gate electrodes, ohmic contacts, interconnection lines, Schottky barrier diode contacts and optoelectronic components.

The following examples are included to illustrate the invention but are not intended to limit the scope of the invention.

EXAMPLE 1

Six doped monocrystalline silicon wafers were provided. Each doped silicon wafer had an n+ doped zone on the front side of the wafer forming an emitter layer and a pn-junction below the emitter layer. The front side of each wafer was coated with a passivation or antireflective layer composed of $Si_3N_4$. The front side of each wafer had a pattern for current tracks through the antireflective layer which exposed the surface of the silicon wafers. Each current track traversed the entire length of the wafer. The current tracks joined a bus bar at an end of each wafer and at the center of each wafer. The back side of each wafer was p+ doped and contained an aluminum electrode.

A hot melt plating resist was selectively applied along the edges of the emitter layer section of each silicon wafer using a SCHMID DOD 300 ink jet apparatus to prevent shunting of the wafer during metallization. The hot melt plating resist included 90 parts by weight paraffin wax, 10 parts by weight of a blend of 80% soy and 20% palm wax, 10 parts by weight candelilla wax and 1 part by weight fluorescing dye. Each wafer was then activated with 1% aqueous hydrofluoric acid for 60 seconds to remove any surface oxides on the silicon. The wafers were then rinsed with water.

Each doped mononcrystalline silicon wafer was immersed into a conventional low temperature aqueous electroless nickel plating composition of NIPOSIT™ PM 988 Electroless Nickel contained in a chemically inert plating cell which was transparent to light. Plating temperature was 35° C. Artificial light was applied to the wafers through out the plating cycle. The light source was a fluorescent lamp. The average intensity applied across each wafer was determined to be 13000 lx. The light was measured using a conventional Fisher Scientific light meter. Nickel plating was done for 30 seconds to provide a nickel layer 200 nm thick.

The nickel plated silicon wafers were then rinsed with water and immediately plated with silver to form current tracks on the silicon wafers. No activation step was used to activate the nickel prior to silver plating. A chemically inert plating cell which was transparent to light containing a cyanide-free silver electroplating composition ENLIGHT™ Silver Plate 620 and a silver anode was provided. The temperature of the electroplating composition was 35° C. A fluorescent lamp was also provided as a source of artificial light. The nickel plated wafers were placed in the silver electroplating composition. Each aluminum electrode on the backside of each wafer and the silver anode were connected to a rectifier to form a complete circuit. The backside potential for each wafer was 0.9 volts and the current density applied during plating was 1.5 to 2 A/dm². Average light intensity was 10,000 lx. LIP silver was done for 4 minutes to form silver current tracks 5 µm thick over the nickel layer. Each wafer was then removed from the silver electroplating composition, rinsed with water and dried.

Each plated silicon wafer was then placed in a Sierra Therm furnace 7500 Series w/T-3 Qz. IR lamps to sinter the silicon wafers and form nickel silicide. The temperature in the furnace was ramped from room temperature to 425° C. over 10 seconds with a peak setting sintering temperature of 425° C. for a period of 10 seconds. The speed at which the wafers passed through the furnace was 150 cm/minute. After the wafers cooled to room temperature, a piece of Scotch transparent tape Cat.# 600 was then applied to the metal plated side of each wafer and then hand pulled from the wafer. Four tape samples removed significant portions of the silver current tracks. The remaining two samples included minor amounts of the silver current tracks with most of the silver current tracks still adhering to the wafer.

EXAMPLE 2

The method described in Example 1 was repeated with four monocrystalline semiconductor wafers. The wafers were doped and metal plated as described in Example 1. The metal plated wafers were sintered in the Sierra Therm furnace starting at room temperature and ramping the furnace temperature to 425° C. for 10 seconds with a peak setting of 475° C. for 10 seconds. After the wafers reached room temperature, a piece of Scotch transparent tape Cat.# 600 was applied to the metal plated surface of each wafer and then the tape was hand pulled from the wafer. Two of the tape samples had minor amounts of silver adhering to their surface. The remaining two tape samples showed no visible signs that any silver was removed.

EXAMPLE 3

The method described in Example 1 was repeated with two monocrystalline semiconductor wafers. The wafers were doped and metal plated as described in Example 1. The metal plated wafers were sintered in the Sierra Therm furnace starting at room temperature and ramping the furnace temperature to 425° C. for 10 seconds with a peak setting of 500° C. for 10 seconds. After the wafers reached room temperature, a piece of Scotch transparent tape Cat.# 600 was applied to the metal plated surface of each wafer and then the tape was hand pulled from the wafer. Both tape samples showed no visible signs that any silver was removed from the current tracks.

EXAMPLE 4

The method described in Example 1 was repeated with two monocrystalline semiconductor wafers. The wafers were doped and metal plated as described in Example 1. The metal plated wafers were sintered in the Sierra Therm furnace starting at room temperature and ramping the furnace temperature to 425° C. for 10 seconds with a peak setting of 525° C. for 10 seconds. After the wafers reached room temperature, a piece of Scotch transparent tape Cat.# 600 was applied to the metal plated surface of each wafer and then the tape was hand pulled from the wafer. Both tape samples showed no visible signs that any silver was removed from the current tracks.

EXAMPLE 5

The method described in Example 1 was repeated with four monocrystalline semiconductor wafers. The wafers were doped and metal plated as described in Example 1. The metal plated wafers were sintered in the Sierra Therm furnace starting at room temperature and ramping the furnace temperature to 425° C. for 10 seconds with a peak setting of 550° C. for 10 seconds. After the wafers reached room temperature, a piece of Scotch transparent tape Cat.# 600 was applied to the metal plated surface of each wafer and then the tape was hand pulled from the wafer. All of the tape samples showed no visible signs that any silver was removed from the current tracks.

EXAMPLE 6

The method described in Example 1 was repeated with two monocrystalline semiconductor wafers. The wafers were doped and metal plated as described in Example 1. The metal plated wafers were sintered in the Sierra Therm furnace starting at room temperature and ramping the furnace temperature to 425° C. for 10 seconds with a peak setting of 600° C. for 10 seconds. After the wafers reached room temperature, a Scotch transparent tape Cat.# 600 was applied to the metal plated surface of each wafer and then the tape was hand pulled from the wafer. Both tape samples showed no visible signs that any silver was removed from the current tracks.

What is claimed is:
1. A method comprising:
   a) providing a silicon containing substrate;
   b) depositing a nickel layer onto the silicon containing substrate;
   c) depositing a silver layer onto the nickel layer; and
   d) heating the silicon containing substrate with the nickel and silver layers in an oxygen containing environment to a sufficient temperature to form a nickel silicide.
2. The method of claim 1, wherein the nickel layer is from 20 nm to 300 nm thick.
3. The method of claim 1, wherein the silver layer is from 1 μm to 30 μm thick.
4. The method of claim 1, wherein heating is done with a peak temperature of 380° C. or greater.
5. The method of claim 1, wherein the nickel is deposited by an electroless process, a light assisted process or an electrolytic process.
6. The method of claim 1, wherein the silver is deposited by an electrolytic process or a light induced plating process.
7. The method of claim 1, wherein the silicon containing substrate is a solar cell, gate electrode, ohmic contact, interconnection line, Schottky barrier diode contact, photovoltaic device or an optoelectronic component.

\* \* \* \* \*